June 11, 1968 J. P. STELMAK 3,387,365

METHOD OF MAKING ELECTRICAL CONNECTIONS
TO A MINIATURE ELECTRONIC COMPONENT

Filed Sept. 28, 1965

INVENTOR.
JOHN P. STELMAK
BY
Brown, Critchlow, Flick & Peckham.
ATTORNEYS.

United States Patent Office 3,387,365
Patented June 11, 1968

3,387,365

METHOD OF MAKING ELECTRICAL CONNECTIONS TO A MINIATURE ELECTRONIC COMPONENT

John P. Stelmak, 325 Walnut St., Greensburg, Pa. 15601

Filed Sept. 28, 1965, Ser. No. 490,863
3 Claims. (Cl. 29—628)

ABSTRACT OF THE DISCLOSURE

An insulating base member is provided with perforations arranged in the same pattern as metal dot contacts on a miniature electronic component. One side of the base member is provided with permanent electric conductors having inner ends covering the perforations. The base member is placed over the component with the inner ends of the conductors on the dot contacts. The perforations are used for gaining access to the underlying conductors for bonding them to the underlying contacts in order to permanently connect the base member and contacts.

In fabricating monolithic thin-film or hybrid types of microcircuit devices, it is necessary to make mechanical connections to very small areas of electronic components in order to provide electrical paths to and from them. The over-all size of such components may be only .050" x .050" x .010", yet in some instances, as many as ten conductors or leads must be attached to a single surface of such tiny elements. These conductors consist of very fine wires, typically .001" in diameter, bonded to metallic lands or contacts that have been deposited on the surface of the component. Each individual wire must be tediously aligned with the contact at one end and with the circuit package lead at the other end. After alignment, the actual attachment may be made by thermo-compression, soldering or ultrasonic bonding. Such microcircuit connections represent by far the most expensive single manufacturing operation and in addition are the biggest source of failure.

It is among the objects of this invention to provide a simple, quick, inexpensive and reliable method of joining electrical conductors directly to miniature electronic components, and to provide a method of making an electronic device that is easy to handle.

In accordance with this invention, an insulating base member is provided with a group of perforations arranged in the same pattern as a group of minute metal contacts that have been applied to the top of a miniature electronic component. One side of the base member is provided with a plurality of permanent electrical conductors having inner ends covering the perforations. The base member is then placed over the component with the inner ends of the conductors on the metal contacts. The perforations are used for gaining access to the underlying conductors in order to bond the conductors to the underlying contacts, whereby the base member and the component will be permanently connected.

The preferred embodiment of the invention is illustrated in the accompanying drawings, in which FIG. 1 is a plan view of an electronic component;

Figures 1, 2, 3, 4, 5:
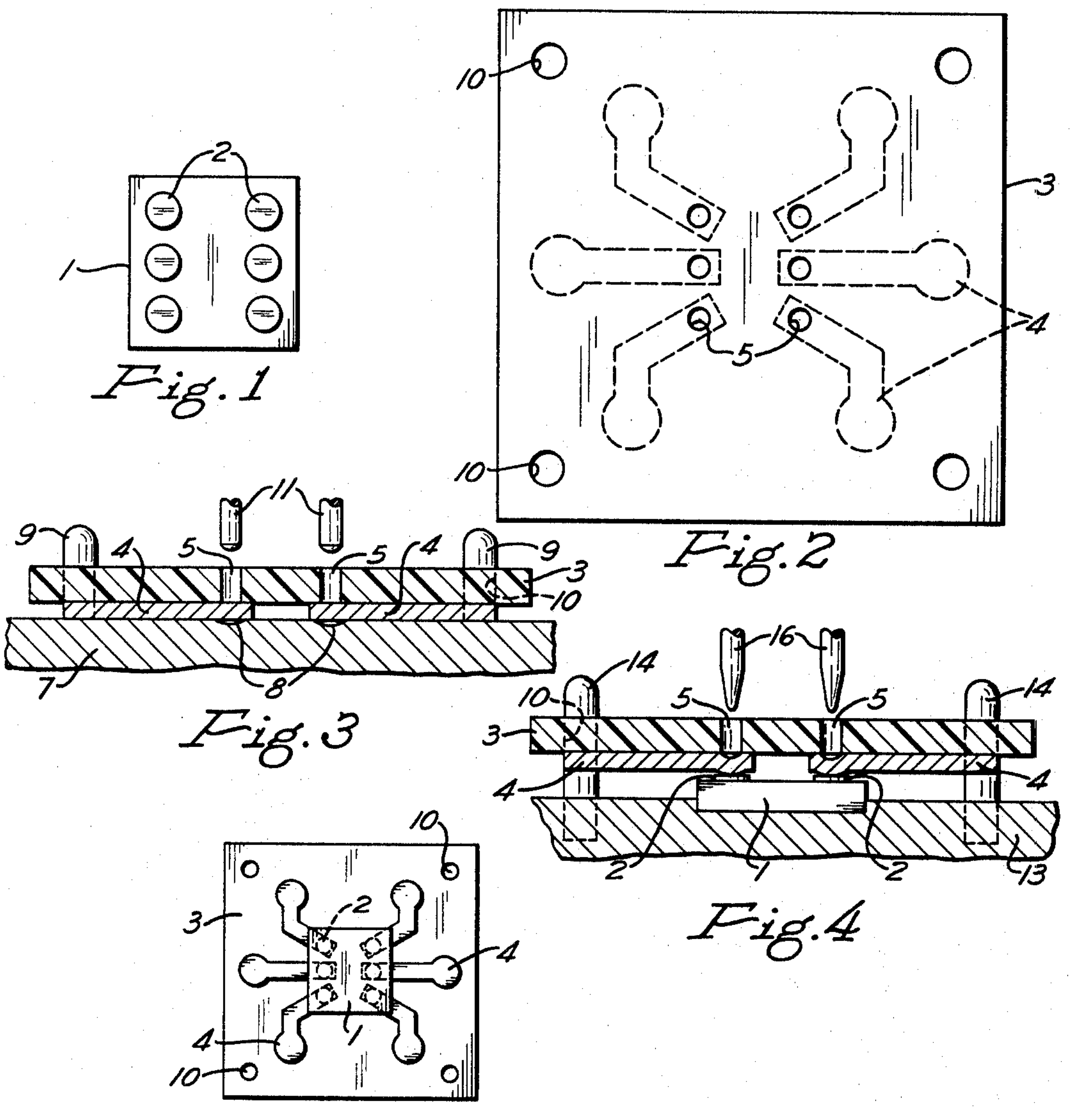
FIG. 2 is a plan view of a perforated base member.
FIG. 3 is a vertical section through the base member and attached conductors, mounted on a die.
FIG. 4 is a vertical section through the base member after it has been removed from the die and placed on the electronic component.
FIG. 5 is a reduced view of the base member and component after they have been connected and inverted.

Referring to FIG. 1 of the drawings, a miniature electronic component 1 of the type that is used in microminiature circuits as described in the second paragraph of this specification is provided on one side with a plurality of minute metal dot-like contacts 2 electrically connected with the active parts of the component. In some cases there may be as many as ten of these contacts. Of course, in the drawing the size of the component is exaggerated greatly.

Another part of the device that is to be formed is shown in FIG. 2. It is an insulating base member 3 provided on one side with a plurality of flat electrical conductors 4. These conductors, which adhere to the base member, are made of any suitable metal and may be only about .0005" thick and .015" wide. A convenient way of forming them is to laminate a film of metal foil on one side of the base member and then etch away all of the metal except that which is to form the conductors, similar to the manner in which printed circuits are made. The insulating base member may be made of any suitable material, preferably a synthetic plastic, and is very thin. For convenience in handling, it may be part of a plastic tape that is only several thousandths of an inch thick and from which the base member can be cut after certain operations have been completed.

Before or after the conductors 4 are formed, the base member is provided with a group of perforations 5 arranged in the same pattern and with the same spacing as the metal contacts on the electronic component 1. The perforations may be about .010" in diameter. The inner ends of the conductors cover the perforations at one side of the base member. The conductors extend away from the perforations in different optional directions and their outer ends are adapted to be electrically connected to leads (not shown) that connect them into an electric circuit.

The next step in my method, which may be unnecessary in some cases, is to place the base member over a die 7 with conductors 4 resting on top of the die as shown in FIG. 3. The die is provided with tiny recesses 8 directly beneath the perforations so that the inner ends of the conductors cover the recesses. To accurately position the base member, the die may be provided with upstanding pins 9 that extend up through guide holes 10 previously punched in the base member. A pin-like tool 11 then is inserted in each perforation 5 and pressed down to deform the underlying portion of a conductor into the underlying recess 8, whereby the bottom of the conductor is provided with a slight protrusion as shown in FIG. 4. A single tool may be inserted in each perforation in succession, or a plurality of like tools may be inserted in all of the perforations simultaneously.

In the next step the base member 3, which has been removed from the die, is positioned over the electronic component 1, which may be held in a predetermined position by placing it in a recess in a jig 13 as shown in FIG. 4, or by some other suitable means. The base member is so positioned relative to the component that the protrusions on the inner ends of the conductors will engage metal contacts 2. The protrusion help space the bodies of the conductors from the component so that there will be no danger of their accidentally engaging areas that should not be touched. The base member is accurately located relative to the component by means of upstanding pins 14 extending up through guide holes 10.

The electrical conductors 4 are attached to the dot contacts on the electronic component by means acting through perforations 5. There are various ways of making the connections, including electronic beams or laser welding, or by inserting a bonding tool 16 in each of the perforations and pressing it down against the underlying conductor. The tool should have a precisely formed tip radius, which may be about .010". A single bonding tool may be inserted in each perforation in succession, or a group of tools may be inserted in all of the perforations simultaneously. The tool or tools then is activated in order to bond the conductors to the underlying contacts. The tool may be activated by heating its tip while pressed tightly against the conductor in the well known thermocompression method, or by simply heating the tool to melt and reflow previously applied solder coatings on the contacts. Another way of activating the tool is to vibrate it while it is pressed against a conductor, as is done in ultrasonic bonding.

After the bonding has been completed the assembly, in which the electronic component, base member and electrical conductors 4 are permanently connected together, is removed from the jig and generally inverted as shown in FIG. 5 so that the necessary electrical connections can be made to the outer ends of the conductors more conveniently. It will be seen that the assembly can be handled with ease during this operation and any subsequent operations, such as encapsulation. A number of the steps in the method disclosed herein can be performed mechanically and much more quickly and reliably than by hand.

Figure 6:
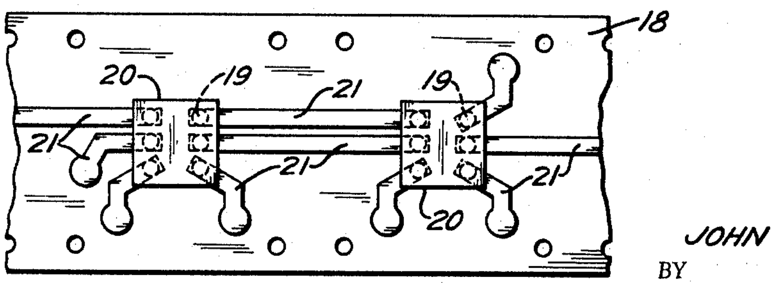
FIG. 6 is a similar view of a modification.

In the modification shown in FIG. 6, an insulating tape 18 of any desired length and width is provided with a plurality of different groups of perforations, each arranged in the same pattern as the contacts 19 on the electronic component 20 that will overlie the perforations. The tape is provided with electrical conductors 21 that cover the perforations and at least some of which extend from one group to another. All of the conductors can be bonded simultaneously to the components held in a jig as described above in my method, with the result that an assembly of interconnected components will be produced on a common base member.

According to the provisions of the patent statutes, I have explained the principle of my invention and have illustrated and described what I now consider to represent its best embodiment. However, I desire to have it understood that, within the scope of the appended claims, the invention may be practiced otherwise than as specifically illustrated and described.

I claim:

1. The method of making electrical connections to a miniature electronic component provided on top with a plurality of minute metal dot contacts, comprising providing an insulating base member with a group of perforations arranged in the same pattern as said contacts, providing one side of the base member with a plurality of permanent electrical conductors having inner ends covering said perforations, placing said base member over said component with said inner ends of the conductors on said contacts, and utilizing each of the perforations to gain access to the underlying conductor for bonding the conductors to the underlying contacts and thereby permanently connecting said base member and component.

2. The method of making electrical connections to a miniature electronic component provided on top with a plurality of minute metal dot contacts, comprising providing an insulating base member with a group of perforations arranged in the same pattern as said contacts, providing one side of the base member with a plurality of permanent flat electrical conductors having bendable inner ends covering said perforations, inserting a pointed tool in each of the perforations and pressing it against the adjoining conductor to deform it and form a protrusion on the opposite side, placing said base member over said component with said protrusions engaging said contacts, and utilizing each of the perforations to gain access to the underlying conductor for bonding the protrusions to the underlying contacts and thereby permanently connecting said base member and component.

3. The method of making an assembly of interconnected miniature electronic components each provided on top with a plurality of minute metal dot contacts, comprising providing an insulating base member with a plurality of groups of perforations each arranged in the same pattern as the contacts on a different one of said components, providing one side of the base member with a plurality of permanent electrical conductors having ends covering said perforations, placing said base member over said components with said ends of the conductors over said contacts, inserting a bonding tool in each of the perforations against the adjoining conductor, and activating the tool to bond the conductors to the underlying contacts and thereby permanently connect said components with the base member.

References Cited

UNITED STATES PATENTS

| | | | |
|---|---|---|---|
| 2,878,552 | 3/1959 | Wirt | 29—470 X |
| 3,130,491 | 4/1964 | Padgett et al. | 29—470 |
| 3,163,588 | 12/1964 | Shortt et al. | 29—625 X |
| 3,189,978 | 6/1965 | Stetson | 29—625 |
| 3,200,020 | 8/1965 | Schroeder | 29—625 X |
| 3,276,106 | 10/1966 | Bester et al. | 29—625 |
| 3,311,966 | 4/1967 | Shaheen et al. | 29—625 |
| 3,133,459 | 5/1964 | Worden | 29—630 X |
| 3,156,514 | 11/1964 | Wing et al. | 29—630 X |
| 3,281,923 | 11/1966 | Best et al. | 29—628 |

JOHN F. CAMPBELL, *Primary Examiner.*

D. C. REILEY, *Assistant Examiner.*